United States Patent
Szczyrbowski et al.

(10) Patent No.: US 6,511,584 B1
(45) Date of Patent: Jan. 28, 2003

(54) CONFIGURATION FOR COATING A SUBSTRATE BY MEANS OF A SPUTTERING DEVICE

(75) Inventors: Joachim Szczyrbowski, Goldbach; Götz Teschner, Hanau; Anton Zmelty, Hösbach; Jürgen Bruch, Hammersbach; Dietmar Marquardt, Erlensee, all of (DE)

(73) Assignee: Unaxis Deutschland Holding GmbH, Hanau (DE)

( * ) Notice: Subject to any disclaimer, the term of this patent is extended or adjusted under 35 U.S.C. 154(b) by 724 days.

(21) Appl. No.: 08/813,689

(22) Filed: Mar. 7, 1997

(30) Foreign Application Priority Data

Mar. 14, 1996 (DE) .......................... 196 10 012

(51) Int. Cl.[7] .............................................. C23C 14/34
(52) U.S. Cl. ........................... 204/192.22; 204/192.12; 204/192.15; 204/192.16; 204/192.23; 204/298.07; 204/298.08; 204/298.19
(58) Field of Search ................... 204/192.12, 192.15, 204/192.16, 192.22, 192.23, 192.32, 298.07, 298.08, 298.09, 298.31, 298.33, 298.34

(56) References Cited

U.S. PATENT DOCUMENTS 4,579,618 A * 4/1986 Celestino et al. ...... 204/298.34
4,693,805 A * 9/1987 Quazi ..................... 204/298.08
4,808,258 A * 2/1989 Otsubo et al. ......... 204/298.34
4,931,169 A  6/1990 Scherer et al. ......... 204/298.11
5,108,569 A * 4/1992 Gilboa et al. .......... 204/192.16
5,281,321 A * 1/1994 Sturmer et al. ........ 204/192.12
5,415,757 A * 5/1995 Szczyrbowski et al. ..................... 204/298.08
5,492,606 A * 2/1996 Stauder et al. ......... 204/298.08
5,651,865 A * 7/1997 Sellers ................... 204/298.07
5,660,700 A * 8/1997 Shimizu et al. ........ 204/298.08

FOREIGN PATENT DOCUMENTS

DE  3700633  5/1988
DE  4343042  3/1995

OTHER PUBLICATIONS

T. Oyama, et al., "High Rate Deposition of $SiO_2$ Films by Pulse–Sputtering", pp. 31–36, Fig. 3), Proc. of the 3rd International Sympositum on Sputtering & Plasma Processes, Jun. 8–9 1995, Japan.
F. Vratny, Deposition of Tantalum and Tantalum Oxide by Superimposed RF and D–C Sputtering, J. Electrochem. Soc.: Solid State Science, May 1967.

* cited by examiner

*Primary Examiner*—Rodney G. McDonald
(74) *Attorney, Agent, or Firm*—Fulbright & Jaworski L.L.P.

(57) ABSTRACT

A sputtering electrode is switched between two power values at a constant reactive gas flow rate which is selected so that the target of the sputtering electrode is in the metallic mode at the first power value while in the oxide mode at a second power value.

17 Claims, 4 Drawing Sheets

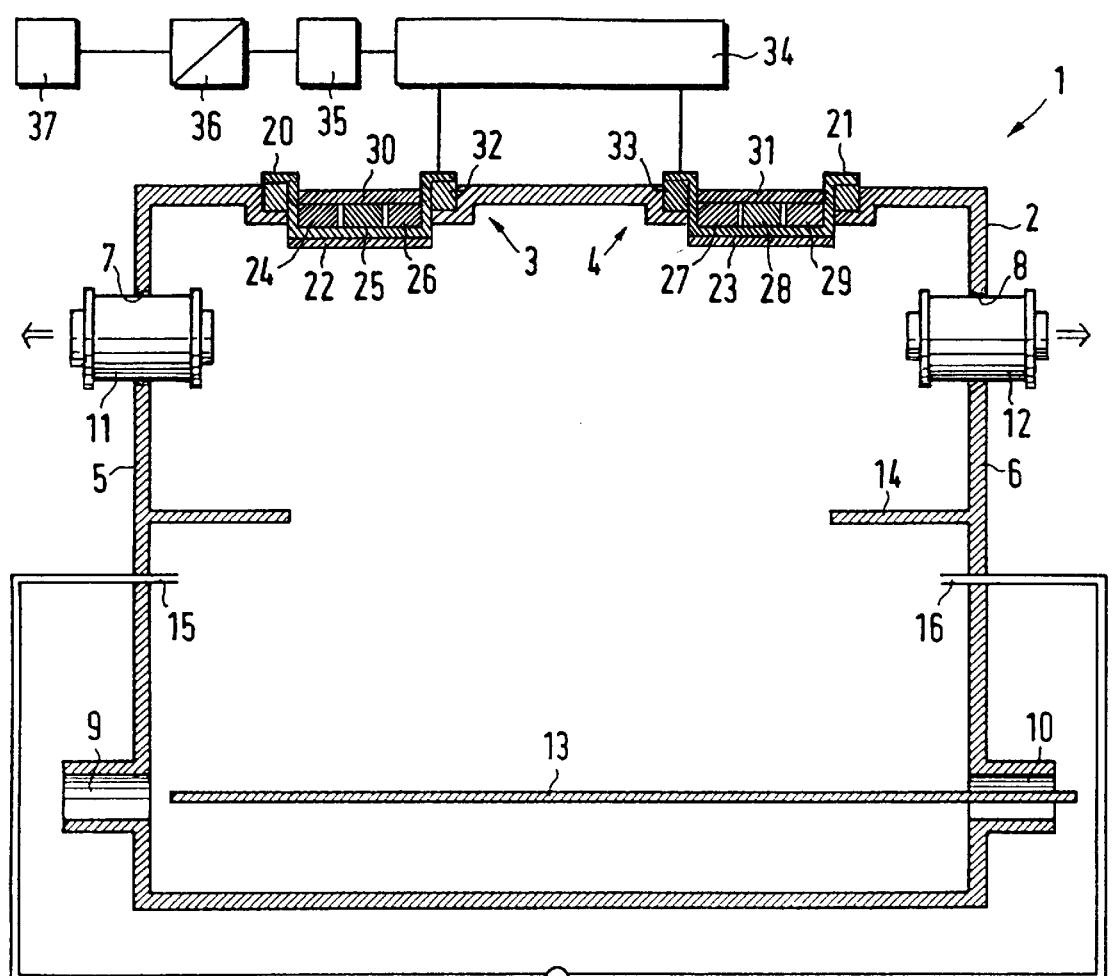
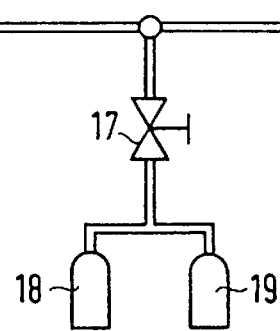
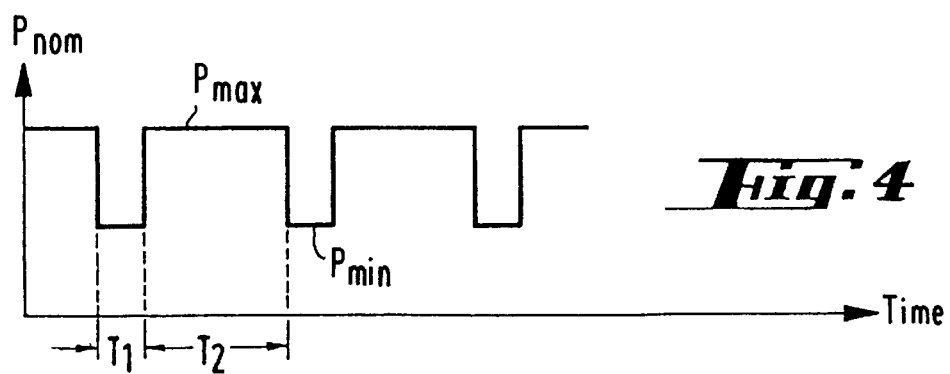

CONFIGURATION FOR COATING A SUBSTRATE BY MEANS OF A SPUTTERING DEVICE

BACKGROUND OF THE INVENTION

The invention relates to a reactive sputtering apparatus for etching or coating in which the discharge voltage of the electrode is a function of the quantity of reactive gas per unit volume, and the power supplied to the electrode can be switched between first and second values.

When coating substrates, for example substrates comprising glass, with metallic coating, for example with aluminum, sputtering devices are frequently used which comprise an electrode with a target. The target is sputtered due to the electrically charged particles impinging on it. In the process, the sputtered particles, potentially after a reaction with a gas, are deposited on the substrate. If the target is penetrated by a constant magnetic field, the combination of electrode, target and magnets, is referred to as a magnetron.

If the metal particles ejected from a target combine with a gas before their deposition on a substrate, the process is referred to as reactive sputtering.

If, for example, $SiO_2$ is to be vapor-deposited onto a substrate, by means of Ar ions Si atoms are ejected from an Si target, which combine with oxygen which is introduced into the process chamber. The introduced oxygen at a constant electrical power affects the discharge voltage at the cathodes of the process chamber. If the discharge voltage is plotted at constant electrical power over the $O_2$ concentration, a curve with hysteresis results (cf. T. Oyama, H. Ohsaki, Y. Ogata, S. Watanabe, J. Shimizu: "High Rate Deposition of $SiO_2$ Films by Pulse Sputtering", pp. 31–36, FIG. 3), Proc. of the 3rd International Sympositum on Sputtering & Plasma Processes, Jun. 8 and 9, 1995, Tokyo, Japan). With increasing oxygen concentration the discharge voltage initially decreases slightly and subsequently drops steeply to a low value. Starting at this value, the discharge voltage subsequently decreases only negligibly with increasing rising oxygen concentration. If the oxygen concentration is now reduced, the discharge voltage increases steeply starting at a specific concentration. Since the oxygen concentrations at which the voltage decreases, respectively increases, steeply are not identical, a hysteresis results.

Setting a stable operating point is made very difficult through this hysteresis because slight changes of the oxygen concentration, and/or the electrical power supplied, can certainly result in a jump of the discharge voltage.

The invention therefore addresses the problem of stabilizing rapidly and simply the operating point in the case of reactive sputtering.

This is done by selecting the power value so that at the same reactive gas flow rate, the target is sputtered in a metallic mode at the first power value and in an oxide mode at the second power value. The cathode is operated intentionally alternating between metallic mode and oxide mode, a mean value of the modes is formed so that the cathode can seemingly be stabilized to the intermediate metallic states between metallic and oxide. In the production of materials such as $TiO_2$ this represents one way of being able to stabilize a high-rate operating points in spite of lacking electrical signals derived from the sputtering process.

BRIEF DESCRIPTION OF THE DRAWINGS

FIG. 3 a sputtering installation with two magnetrons and an intermediate frequency power supply;

FIG. 4 a representation of the nominal power value over time;

DETAILED DESCRIPTION OF THE PREFERRED EMBODIMENTS

Figure 1:
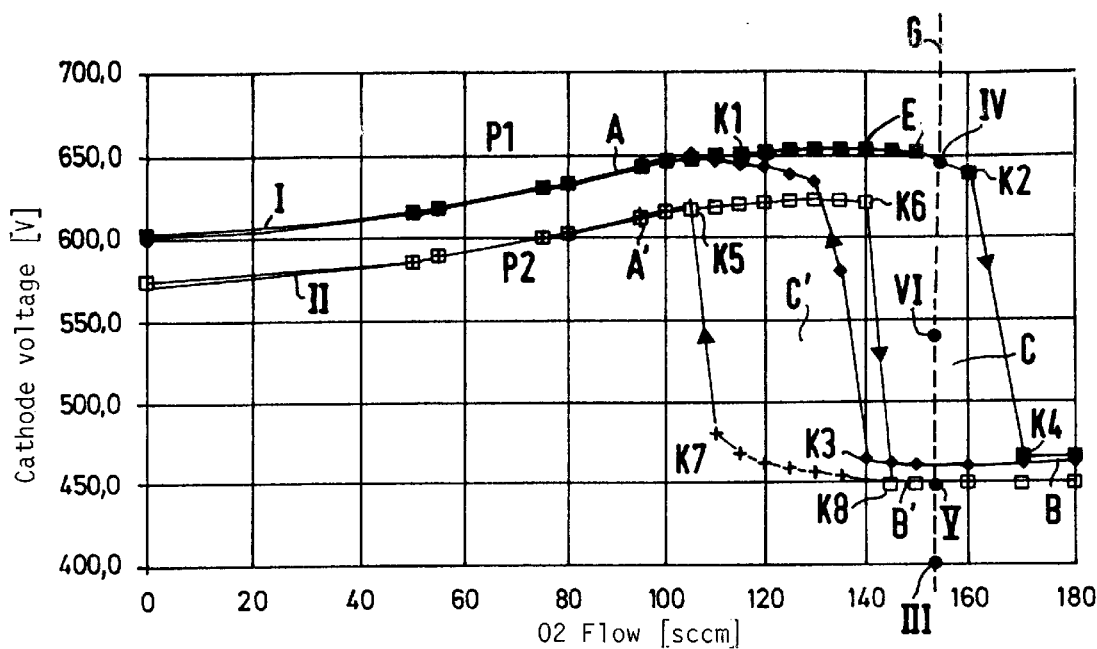
FIG. 1 voltage-oxygen characteristics of an NiCr sputtering process at two different electrical sputtering powers.

In FIG. 1 two voltage-oxygen characteristics of an NiCr sputtering process are shown at two different electrical sputtering powers P1 and P2. These NiCr characteristics are representative of numerous other metal characteristics which are obtained if metal targets or metal alloy targets are sputtered.

The upper characteristic I is obtained at a constant electrical power P1 while the lower characteristic II is obtained at a constant electrical power P2. P1 is here greater than P2. The voltages are given in volts and the oxygen flow is specified in sccm=standard cubic centimeter per minute.

Characteristics I, II are clearly divided into three ranges: an upper range A, respectively A', a lower range B, respectively B', and an intermediate range C, respectively C'. The intermediate range C, respectively C', characterizes here the hysteresis.

Ranges B, B' are denoted as oxide mode while ranges A, A' are denoted as metallic mode.

In the metallic mode A, A' the target which is being sputtered still has a metallic surface while in the oxide mode B, B' it is strongly oxidized.

The sputtering rates in the metallic mode are high and low in the oxide mode. One therefore aims to keep the sputtering process as much as possible in metallic mode and to avoid sliding into oxide mode. Such sliding can occur if, due to fluctuations in the process, the oxygen flow temporarily exceeds the value of point K2, respectively K6, in FIG. 1.

As can be seen in FIG. 1, with changing powers the hysteresis or intermediate ranges C, C' also shift.

With these ranges, the break points K1, K2, K3, K4, respectively K5, K6, K7, K8 of curves I respectively II. If the electrical power is increased for example from P1 to P2, more oxygen is required to obtain the same oxygen saturation of the target as before. Therewith, the break points K5–K8 of the characteristic II shift to the break points K1–K4 of characteristic II, with which higher oxygen flows are associated.

If the cathode is in metallic mode A and if the electrical power is decreased from P1 to P2, a greater oxygen excess develops at constant oxygen supply. Because, due to the decreased power, less material is sputtered off, less oxygen is also consumed so that the oxygen fraction increases in the sputtering gas and thus also in the target surface. If a specific point in the oxygen fraction in the target surface is exceeded, the sputtering rate continues stationary and therewith the oxygen content in the sputtering gas increases. Selfaugmentation takes place. If, for example, a sputtering installation at power P1 is operated with an oxygen supply of 140 sccm, a relatively stable operating point E on characteristic I is obtained. If, now the power is reduced to P2, the operating point jumps to point K6 of characteristic II and consequently drops to point K8. This process is referred to as the breakover of the cathode into oxide mode, for example in point K6. It is consequently a self-augmenting process. If on characteristic I operation takes place in a range in which a curve II has a break point K6, power fluctuations up to P2 of a current generator are thus sufficient to generate a breakover.

From a technological point of view the range C, respectively C', is of great interest. Very good layer properties at high coating rates are obtained. The goal is therefore to work in this range.

In order to avoid the breakover in this range, according to the invention switching back and forth between the first power P1 and the second power P2 takes place, and specifically at constant reactive gas flow. In the cathode surface an oxygen fraction is thus stabilized which corresponds to a virtual operating point in the hysteresis range C, respectively C'.

If a constant reactive gas flow is located for example in point III, thus at approximately 152 sccm, at a power P1 the operating point IV is positioned, i.e. a discharge voltage of approximately 650 volts at the cathode.

If now at an identical reactive gas flow intentional switching to the power P2 takes place, the operating point V on characteristic II is positioned.

If switching occurs continuously between P1 and P2, the virtual operating point VI is obtained which is disposed between IV and V and thus between the two modes. The intersecting line G, which in FIG. 1 passes through points IV, VI, V and III, should be between points K1–K8. If the intersecting line G were to pass for example through point K6, no unique result would be observed when switching from P1 to P2 because the curve II at 140 sccm would have two points of intersection with the intersecting line G, i.e. it would be uncertain whether or not the operating point at power P2 would be at K6 or in the proximity of K8. The distance of the straight line G from point K2 in FIG. 1 is relatively small and in practice should be somewhat greater.

If, on the other hand, the straight line G were to be shifted parallel to the right and placed through point K2, the point of intersection with curve II in the oxide range would be relatively unique, however, when switching over to power P1 an unstable range of curve I could be met so that the operating point probably remains in oxide mode.

For carrying out the process according to the invention, the procedure is usefully as follows:

At least two characteristics I, II are recorded, such as are depicted in FIG. 1. If these characteristics are known, first the low power P2 is set and oxygen is supplied until the voltage in point K6 breaks down to point K8. Now a little more oxygen is supplied so that the straight line G has an interval at the right from break point K8. This interval is defined by point V. At the oxygen flow now set, switching to the higher power P1 takes place and ascertained whether or not the cathode voltage jumps upward and subsequently remains approximately constant. If this is the case the oxygen supply is established. If the voltage is unstable, the gas flow is changed because in this case the second point of intersection of the straight line G lies on a hysteresis branch. The change of the gas flow takes place until a stable voltage obtains.

Figure 2:
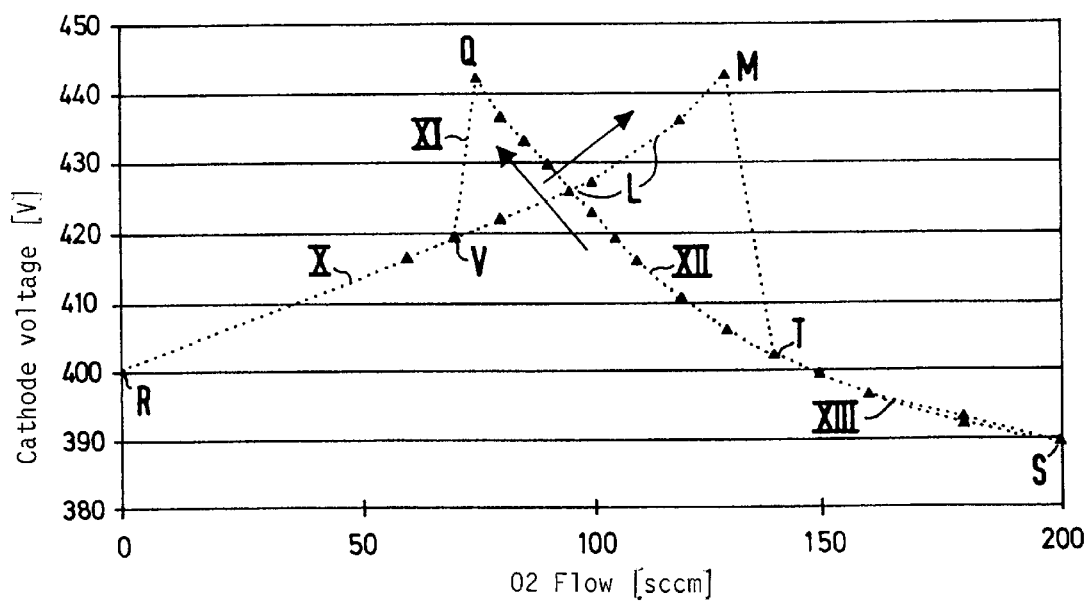
FIG. 2 a voltage-oxygen characteristic of a Ti sputtering process at constant electrical power.

In FIG. 2 is depicted a further voltage-oxygen characteristic which, however, applies for a titanium target. This characteristic refers only to an electrical sputtering power and is only intended to show that the voltage-oxygen characteristics are strongly dependent on the material. If, starting at zero, the oxygen supply is gradually increased, the voltage in range X increases linearly at constant electrical power in order to drop abruptly at point M to point T. With a further increase of the oxygen supply the voltage in range XIII decays parabolically and assumes its lowest value in point S.

If the oxygen supply is now reduced again, the voltage in range XIII is initially exactly converse to that which occurs with oxygen increase. However, beginning at point T the voltage increases up to a point Q and drops abruptly to point V with further oxygen reduction and reaches the same characteristic in range X as it does with an oxygen increase.

A second characteristic not shown in FIG. 2, which is recorded at another power set, would have a similar curve form however with an offset to the side and upward. The two points between which switching takes place would need to have a secure interval from points V, Q, M and T or from the corresponding points of the (not shown) second characteristic.

The virtual operating point VI shown in FIG. 1 can be shifted upward or downward through suitable selection of a pulse-duty factor between P1 and P2 on the straight line G. The way this occurs specifically will be explained later in connection with FIGS. 4 and 8.

In FIG. 3 a sputtering installation 1 is depicted with which the invention can be realized. It comprises a vacuum chamber 2 in which two magnetrons 3, 4 are disposed. In sidewalls 5, 6 of the vacuum chamber 2 upper openings 7, 8 and lower openings 9, 10 are provided with vacuum pumps 11, 12 disposed in the upper openings while the lower openings 9, 10 serve for through putting a substrate 13, for example a glass plate, through the vacuum chamber 2. Between the lower openings 9, 10 and the upper openings 7, 8 is disposed a diaphragm 14 which projects from the side walls 5, 6 into the interior of the vacuum chamber 2. Below this diaphragm 14 are disposed gas feedlines 15, 16 which are connected with gas tanks 18, 19 via a valve 17.

Each of the magnetrons 3, 4 comprises a cathode pan 20, 21 which is provided on its underside with a target 22, 23. In the cathode pan 20, 21 are disposed three permanent magnets each 24, 25, 26, respectively 27, 28, 29, which are connected with a common yoke 30, 31. The cathode pans 20, 21 are fitted via seals 32, 33 into the upper side of the vacuum chamber 2. Both cathode pans 20, 21 are connected with an intermediate frequency power supply 34 which, in turn, is connected to an power regulator 35 which is driven by a computer 37 via a digital-analog converter 36.

In FIG. 3 the two magnetrons 3, 4 of the sputtering installation are disposed closely adjacent and in the same chamber 2. However, it is also possible to provide two separate compartments in chamber 2 of which each has an individual magnetron. The gas inlets 15 to 19 are laid out so that the same reactive gas composition is supplied to each magnetron 3, 4.

The electrical power supplied to the cathodes 20, 21 is modulated via the intermediate frequency generator 34.

Such power modulation is known per se in sputtering technology (cf. EP-A-0 347 567, DE-C-3 700 633). In this modulation the power oscillates in pendulum fashion between two values, however, with this oscillation neither a stable operating point setting is intended nor is it possible. The same applies also to other known configuration in which at the cathode a polarity reversal and consequently a power change is brought about (EP-A-0 591 675; DE-A-42 37 517, FIG. 1, 2; DE-A-43 43 042, column 4, lines 48 to 62). In the case of the known power modulations, the change of power is as a rule a consequence of an intended voltage change, i.e. the fundamental interest is not directed toward a change of the electrical power.

FIG. 4 shows the power modulation according to the invention. It is evident that the amplitude of the nominal power $P_{nom}$ is periodically changed approximately by the factor 2 with the higher power $P_{max}$ being present approximately three times as long as the lower power $P_{min}$, i.e. the pulse-duty factor $T_2/T_1$ is approximately three. The powers denoted by $P_{max}$ respectively $P_{min}$ correspond herein to the powers P1 and P2 according too FIG. 1. They are selected according to specific criteria. The representation of FIG. 4 shows only the envelope, respectively, the mean value, of the power. In reality in each pulse comprise approximately 4000 half waves of the intermediate frequency power at a typical modulation frequency of 10 Hz and an intermediate frequency of 40 kHz.

In terms of circuit technology the power curve can be realized such that a computer 37 outputs at the beginning and at the end of time $T_1$, $T_2$ a digital command to the digital-analog converter 36 which converts it into an analog signal and impresses it onto the power regulator 35 which controls the power supplied to the cathodes 20, 21. The nominal value determined by the computer is switched at a cycle frequency $1/(T_1+T_2)$ from approximately 10 Hz between a high and a low nominal value. The 10 Hz are herewith specified. The frequency is selected so that the cathode burns stably in the transition range. If the frequency becomes too low, the cathode migrates too far into the particular mode and can flip uncontrollably into one of these modes. At too high a frequency the stabilization effect of the operating point vanishes.

The two values $P_{max}$ and $P_{min}$ (respectively P1 and P2 in FIG. 1) are selected so that the high nominal power value $P_{max}$ at the given oxygen flow would cause an operating point in the metallic mode, respectively the low nominal power value $P_{min}$ an operating point in the oxide mode, if switching were not to take place. Thereby that the power is changed periodically, the cathodes remain in the transition states between the two modes. By changing the generator voltage, the plasma impedance is also changed automatically. Therefore, what is regulated is the voltage change.

Expressed differently: the power is technically regulated by changing the electrical DC voltage supplied to the electrodes, because a voltage change causes a change of the plasma impedance which, in turn, leads to changed current flows. However, the electrical power is determined by the current flowing and the voltage present.

Figure 5:
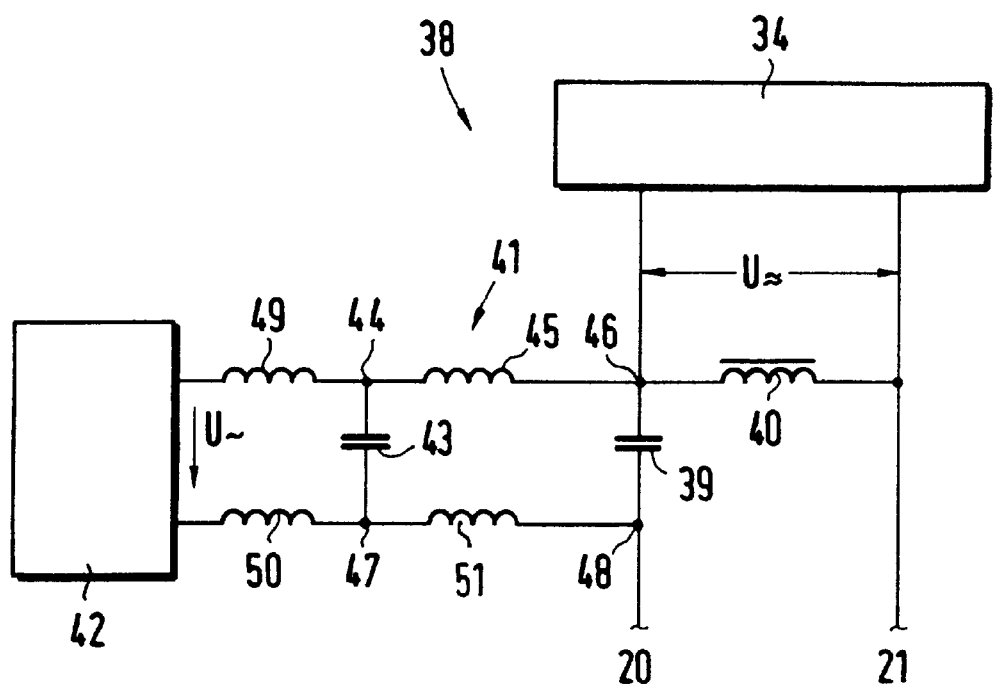
FIG. 5 an intermediate frequency power supply and an AC voltage source with interconnected intermediate frequency filter circuit.

In FIG. 5 is depicted a circuit configuration 38 with which different powers can be output to the cathodes. The modulation of the power in cathodes 20, 21 is herein not generated by driving the intermediate frequency generator 34 but rather between the intermediate frequency generator 34 and the cathodes 20, 21 a network is inserted which comprises a capacitor 39, a DC current choke 40, a filter 41 and a AC voltage source 42. This source has the same frequency as the AC voltage source 35, (FIG. 3) namely approximately 10 Hz. The filter 41 comprises, for example, a capacitor 43 which is connected with its one terminal 44 via a first inductor 45 to the one terminal 46 of the capacitor 39 and with its other terminal 47 via a second inductor 51 to the other terminal 48 of capacitor 39. In addition, its terminals 44, respectively 47, are connected via one inductor 49, 50 each to the AC voltage source. The intermediate frequency energy is fed via capacitor 39 into the cathodes 20, 21. The power modulation occurs because onto the power from the intermediate frequency generator 34 at capacitor 39 is superimposed an additional AC voltage power from AC voltage source 42. This causes the current-voltage characteristics of cathodes 20, 21 to be shifted. The result of this shift leads to the fact that the cathodes 20, 21 operate at different power. The filter 41 is an intermediate frequency filter which prevents that electrical power flows from the intermediate frequency generator 34 to the AC current source 42. It is intended to represent a high impedance for the intermediate frequency source 34 and a low impedance for the AC current source 42.

The additional AC voltage of the AC voltage source 42 is selected such that the one cathode 20, if the negative half-wave of the AC voltage is present at it, consumes so much power that it would operate at comparable operation with constant intermediate frequency power in the metallic mode. The other cathode 21 consumes at the same time less power so that at comparable operation with constant intermediate frequency power it would operate in the oxide mode. In this way a similar effect is achieved as with the modulation of the intermediate frequency power, with the difference that in the case of FIG. 3 both cathodes 20, 21 sputter in the same mode while in the case of FIG. 5 one cathode 20 or 21 operates in metallic and one cathode 21 or 20 in oxide mode. By intermediate frequency is here understood a frequency in the range of a few kHz up to approximately 100 kHz. A preferred intermediate frequency for example has 40 kHz.

Figure 6:
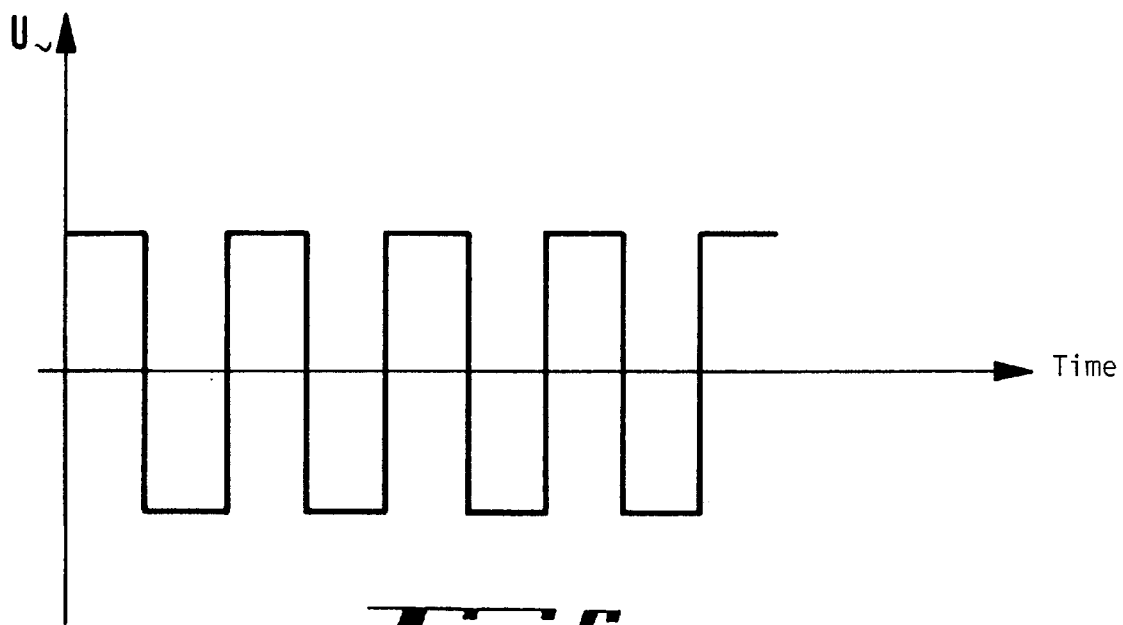
FIG. 6 the output voltage of the AC voltage source over time.

The frequency of the AC voltage source 42 is the same as that of the AC voltage source 35 in FIG. 3, i.e. approximately 10 Hz. FIG. 6 depicts the trace of this AC voltage $U_\sim$. The AC voltage can be rectangular as well as also sinusoidal.

The power supplied to one or two cathodes can also originate from a DC power source onto which an AC current is superimposed. Such power sources comprised of DC and AC current sources are known in principle (cf. F. Vratny, Deposition of Tantalum and Tantalum Oxide by Superimposed RF and DC-sputtering, J. Electrochem. Soc.: Solid State Science, May 1967, p. 506, FIG. 1) and for that reason do not need to be discussed in further detail. The AC current frequency used according to the invention is, however, between approximately 1 and 30 Hz and is thus considerably lower than in the case of the known circuit configuration in which it is in the MHz range.

Figure 7:
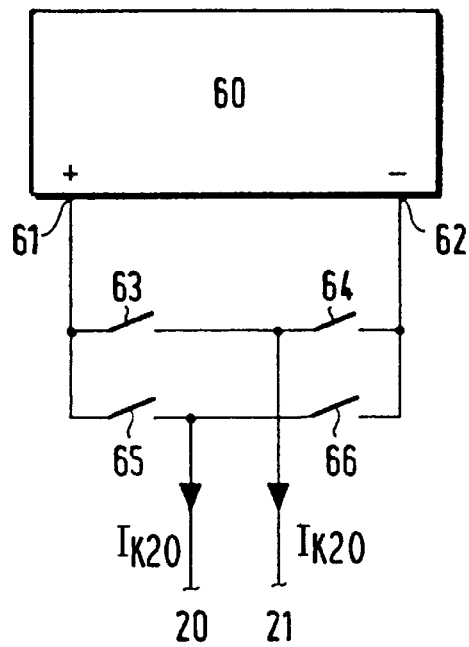
FIG. 7 a switch configuration between a DC power supply and sputtering cathodes.

In FIG. 7 a further configuration is depicted which permits varying the power supplied to the cathodes. Herein a DC current supply 60 is provided which is a constant current source. In parallel with the output terminals 61, 62 of the DC current supply are disposed in series two first controllable switches 63, 64 with which two further series-connected controllable switches 65, 66 are connected in parallel.

The constant DC current of the current supply 60 is supplied to the cathodes 20, 21 through the controllable switches 63 to 66 at the AC side. Between the phases in which the cathodes 20, 21 conduct current, is a switching point at which the change-over switch 63 to 66 shortcircuits the DC current supply 60 so that no current can flow to the cathodes 20, 21. This shortcircuit can result from simultaneous closing of switches 63, 64 or switches 65, 66 or the switches 63 to 66.

Change-over switch 63 to 66 is controlled asymmetrically so that the burn times and thus the power contributions of the two cathodes 20, 21 are different within a given period of time. This allows one cathode 20 to sputter in the metallic and the other cathode 21 in the oxide mode. If this asymmetry is periodically alternated the same effect is achieved as with modulation of the intermediate frequency power by means of an additional AC voltage according to FIG. 5.

A further option of power supply is given if in the configuration according to FIG. 5 the AC voltage source 42 and the filter 41 is omitted and instead of choke 40 a special filter is used. This filter is in this case dimensioned so that it has a resonance frequency $f_1$ in the proximity of frequency $f_0$ of the intermediate frequency generator 34. If this intermediate frequency generator 34 is a free-running generator whose frequency is not stabilized, floating results leading to a modulation effect.

Figure 8:
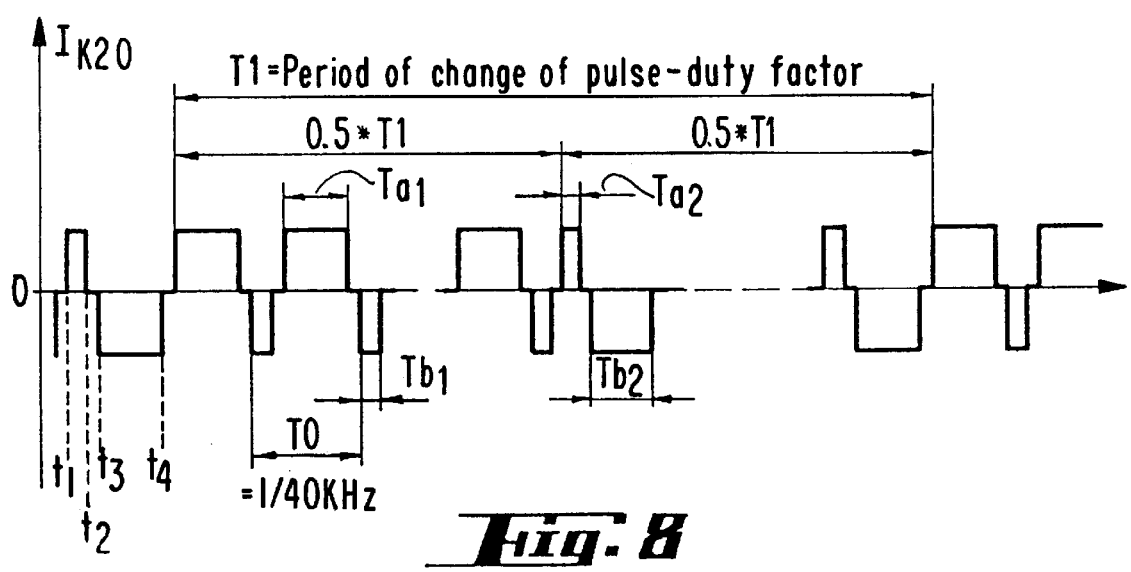
FIG. 8 the current flowing through one cathode of a double-cathode configuration over time.

In FIG. 8 is depicted a current-time diagram for the configuration of FIG. 7. This shows the way in which the current $I_{K20}$ flows through cathode 20 as a function of time. The current flowing through cathode 21 is not shown. However, it is identical with the current flowing through cathode 20 with the exception of one phase shift. At time $t_1$ with switches 63, 64 open, switch 65 is closed so that a positive current $I_{K20}$ flows from the current supply 60 to cathode 20.

At time $t_2$ switch 65 is opened again, i.e. current ceases to flow from the positive terminal of current supply 60 to cathode 20. At time $t_3$ switch 66 is closed so that current $I_{K20}$ flows from the negative terminal of current supply 60 to cathode 20. If switch 66 is opened at time $t_4$, no negative current can flow to cathode 20.

Opening and closing of switches 65, 66 is now continued such that the current trace shown in FIG. 8 results. Cathode 20 is initially supplied for a relatively short time interval $t_2$–$t_1$ with positive current while subsequently it is supplied for a somewhat longer time interval $t_4$–$t_3$ with negative current. Subsequently it is supplied with positive current for the longer time interval $|t_4"t_3|$. Hereupon it receives for the shorter time interval $|t_2$–$t_1|$ negative current, subsequently again for the longer interval $|t_4$–$t_3|=T_{a1}$ positive current and subsequently again for the shorter time interval $|t_2$–$t_1|=T_{b1}$ negative current.

Indices a and b with T refer to the time interval of the positive and negative current value of cathode 20 in a period $T_0$ of the intermediate frequency source. The additional modulation has the period $T_1$. In the first half of period $T_1$ the entire time interval of the positive current in the cathode 20 is longer than the time interval of the negative current. In the second half the entire time interval of the negative current is longer than that of the positive current.

The longer time interval $T_{a1}$ and the shorter time interval $T_{b1}$ together form the time interval $T_0$, i.e. the period length of the intermediate frequency voltage generated by switching over the DC current source 60. This period length is for example 25 $\mu$s or 1/40 kHz.

Analogously to cathode 20, cathode 21 is supplied with current, with the difference, however, that the switches 63 and 64, instead of switches 65 and 66, are opened respectively closed.

What is claimed is:

1. Process for coating a substrate by reactive sputtering, said method comprising
   providing at least one electrode carrying a metal target in a process chamber,
   feeding a reactive gas into said process chamber at a flow rate,
   supplying electrical energy to the electrode so that the electrode has a discharge voltage which is a function of the reactive gas flow rate, and
   switching said electrode periodically between a first power level and a second power level, said flow rate of the reactive gas being maintained at a constant reactive gas flow rate at which the target is sputtered in a metallic mode at the first power level and the target is sputtered in an oxide mode at the second power level so that the cathode has apparent stabilization to an intermediate state between the metallic and oxide modes.

2. Process as in claim 1 comprising
   providing a first and second electrode from said at least one electrode carrying metal targets in said process chamber, and
   supplying both of said electrodes with the same power at a given point in time.

3. Process as in claim 1 comprising providing a first and second electrode from said at least one electrode carrying metal targets in said process chamber,
   supplying said first electrode with said first power level while said second electrode is supplied with said second power, and
   supplying said first electrode with said second power level while said second electrode is supplied with said first power level.

4. Process as in claim 1 further comprising
   determining a first discharge voltage versus gas flow rate characteristic at said first power level,
   determining a second discharge voltage versus gas flow rate characteristic at said second power level, and
   selecting said constant reactive gas flow rate so that an operating point on said first characteristic causes said target to be sputtered in said metallic mode and an operating point on said second characteristic causes said target to be sputtered in an oxide mode.

5. Apparatus for coating a substrate by reactive sputtering, said apparatus comprising
   at least one electrode carrying a metal target in a process chamber,
   means for feeding a reactive gas into said process chamber at a reactive gas flow rate and for maintaining the flow rate at a substantially constant reactive gas flow rate,
   an electrical energy source for supplying electrical energy to the electrode so that the electrode has a discharge voltage which is a function of the reactive gas flow rate, and
   means for switching said electrode periodically between a first power level and a second power level, said power levels being selected so that, at said constant reactive gas flow rate, the target is sputtered in a metallic mode at the first power level and the target is sputtered in an oxide mode at the second power level so that the cathode has apparent stabilization to an intermediate state between the metallic and oxide modes.

6. Apparatus as in claim 5 wherein said switching means comprises a modulated AC voltage source.

7. Apparatus as in claim 5 wherein said switching means comprises a DC current source onto which an AC voltage is superimposed.

8. Apparatus as in claim 7 wherein said AC voltage has a frequency of 2 to 30 Hz.

9. Apparatus as in claim 5 wherein said switching means comprising a DC current source having outputs which are switched by means of switches.

10. Apparatus as in claim 5 wherein said switching means switches between said first and second power levels at a cycle frequency of 10 Hz.

11. Apparatus as in claim 5 wherein said switching means comprises a first AC voltage source which is modulated by a second AC voltage source.

12. Apparatus as in claim 11 wherein said first and second AC voltage sources are connected by a network comprising a capacitor connected to the output of said first AC voltage source.

13. Apparatus as in claim 5 further comprising permanent magnets connected to said electrode to form a magnetron, said apparatus further comprising a diaphragm between said magnetron and the substrate to be coated.

14. Apparatus as in claim 5 wherein said electrical energy source comprises an intermediate frequency generator with a frequency $f_0$, and a network with a resonance frequency $f_1$ which is so close to $f_0$ that floating which modulates the power of the apparatus results.

15. An apparatus for coating a substrate by reactive sputtering, said apparatus comprising:

a process chamber;

at least one electrode carrying a metal target in said process chamber;

means for feeding a reactive gas into said process chamber at a flow rate;

an electrical energy source connected with the electrode and supplying electrical power thereto, the electrode functioning according to a characteristic curve relative to the flow rate where the electrical power is constant with a metallic mode and an oxide mode;

the power supplied to the electrode oscillating between a first power level and a second power level shifting periodically between an operating point wherein the target is sputtered in the metallic mode or an intermediate mode between the metallic mode and the oxide mode, and an operating point wherein the target is sputtered in the oxide mode;

the operating points of said modes being selected so that it is not possible to operate a stable sputtering process with stable sputter conditions at an operating point between said operating points.

16. An apparatus as in claim 15, wherein said reactive gas and power values being selected such that the operating points for said power levels are in stable portions of the characteristic curve.

17. Process for coating a substrate by reactive sputtering, said process comprising the following steps:

providing at least one electrode carrying a metal target to be sputtered in a process chamber, feeding a reactive gas into said process chamber at a flow rate, supplying electrical power to said electrode whereby the discharge voltage of said electrode depends on said electrical power and on said gas flow rate in such a manner that at a flow rate the discharge voltage abruptly changes its level when the electrical power changes and shows an area of hysteresis, keeping said flow rate of said reactive gas constant within said area of hysteresis, switching said electrode periodically between a first power level and a second power level within the area of hysteresis said first power level indicating a mode at which the surface of said target is metallic, said mode being a metallic mode, said second power level indicating a mode at which the surface of said target comprises an oxide, said mode being an oxide mode, so that the cathode has a virtual operation point at an intermediate state between the metallic and the oxide modes resulting in a stable process.

\* \* \* \* \*